PHOTOLITHOGRAPHIC MASKS OF SEMICONDUCTOR MATERIAL

Filed June 1, 1970

INVENTORS
VEN Y. DOO
JOSEPH REGH
DAVID K. SETO
BY
John F. Ohlandt
ATTORNEY

United States Patent Office 3,701,659
Patented Oct. 31, 1972

3,701,659

PHOTOLITHOGRAPHIC MASKS OF SEMICONDUCTOR MATERIAL

Ven Y. Doo, Poughkeepsie, Joseph Regh, Wappingers Falls, and David K. Seto, Lagrangeville, N.Y., assignors to International Business Machines Corporation, Armonk, N.Y.

Filed June 1, 1970, Ser. No. 42,344
Int. Cl. G03c *5/00*
U.S. Cl. 96—38.3 3 Claims

ABSTRACT OF THE DISCLOSURE

A photolithographic mask comprising a substrate of quartz or glass and a pattern-defining layer of a semiconductor material such as silicon. The pattern is defined in the semiconductor material by etching of the semiconductor, involving displacement of the semiconductor in selected areas with a metal such as copper. In this way, a high resolution mask is obtainable having the added feature of being partially transparent.

BACKGROUND, OBJECTS AND SUMMARY OF THE INVENTION

This invention relates to photolithographic techniques as these are employed in the manufacture of semiconductor integrated circuits and more particularly, to an improvement which yields a superior photographic or photolithographic mask.

The term "integrated circuits" encompasses a wide variety of techniques and forms which have been developed in the field of microcircuitry over the past decade. In one of the most advanced of its forms, i.e. the so-called monolithic integrated circuit, the planar microcircuit technology is practiced. By such practice the devices forming a complex circuit are embedded within the wafer by means of diffusion from the upper surface of the semiconductor wafer and interconnections between devices are made by metalization of the upper surface. In controlling the diffusion of impurities into the monolith or wafer to form the requisite devices, photolithographic techniques are utilized which involve as many as seven masks in performing the sequence of steps necessary to embed the devices within the monolith and to interconnect the devices by metalization.

The aforesaid photolithographic techniques enable the ready accomplishing of preferential oxide etching which is essential in producing the sequence of diffusion operations. In order to provide suitable oxide etching, the wafer is coated with a "photoresist" in which a desired circuit pattern is developed by exposing selected areas of the photoresist whereby the oxide layer underlying the photoresist can be selectively attacked.

In order to prevent confusion, it is useful to note that there are three different kinds of "masks" that are referred to in connection with integrated circuit manufacture: A photographic or photolithographic mask, a photoresist mask and an oxide mask. A photolithographic mask, generally speaking, is either a positive or negative image of a circuit pattern formed on a photosensitized glass plate. Thus, a photolithographic mask usually comprises a matrix or substrate of glass or similar material and a layer of photo emulsion, or in some cases a layer of chromium or the like, in which the circuit pattern is defined. The purpose of a photolithographic mask is the formation of a resist mask, the purpose of the latter being to selectively etch the oxide or metal that it covers. The so-called oxide mask is defined by a selectively etched pattern of openings in the oxide which permits the selective diffusion of impurities into the wafer.

As noted heretofore, the present invention resides in an improvement in the photolithographic mask used to create the desired pattern in the resist mask. Thus, the improved photolithographic mask comprises a substrate of quartz or glass and a deposited layer thereon of fine-grained amorphous silicon or silicon-germanium alloy, the semiconductor layer having etched out portions which have been replaced with a metal such as copper, thereby to produce the desired masking pattern. The selection of a silicon-germanium alloy takes advantage of the wide range of the wavelengths, which provides a high absorption coefficient.

In another aspect, the present invention embraces the technique for producing the aforesaid photolithographic mask comprising the essential steps of depositing a layer of semiconductor material on a quartz or glass substrate and photolithographically etching the semiconductor material by means of a copper displacement chemical reaction to produce the requisite mask-defining openings in the semiconductor material.

It should be emphasized that the improved mask will be able to withstand usage involving contact with an uneven silicon wafer. This is in contrast to the photo emulsion type of mask which is not able to take such contact due to the softness of the emulsion. Moreover, it should be noted that the metal displacement etching technique, which is advantageously utilized in conjunction with the semiconductor pattern-defining layer, permits the creation of openings in the silicon, or similar semiconductor layer having extremely sharp edges, this being in contrast with the openings obtained in photo emulsion layers.

DESCRIPTION OF PREFERRED EMBODIMENTS

Figure 1:
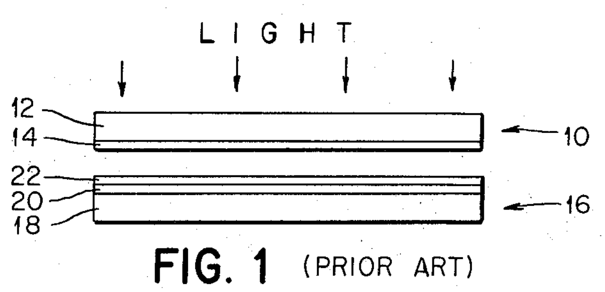
FIG. 1 (PRIOR ART)
FIG. 1 is a sectional view illustrating the general photolithographic technique known in the prior art.

Referring for the moment to FIG. 1, there is illustrated the general photolithographic technique known in the art. In accordance with this technique a photolithographic mask 10, comprising a substrate 12 of glass or the like, and a pattern-defining layer 14 consisting of a photo emulsion material or chromium, is disposed in spatial relationship to a semiconductor structure 16. The structure 16 comprises a semiconductor wafer 18, the upper surface of which is coated with an oxide layer 20, for the purposes of selective diffusion; and superposed on the oxide layer as a photoresist layer 22.

As will be understood, exposure to ultra-violet light of the structure 16 by way of the mask 10 results in a creation of a pattern in the photoresist layer 22.

Figures 2A, 2B, 2C, 2D:
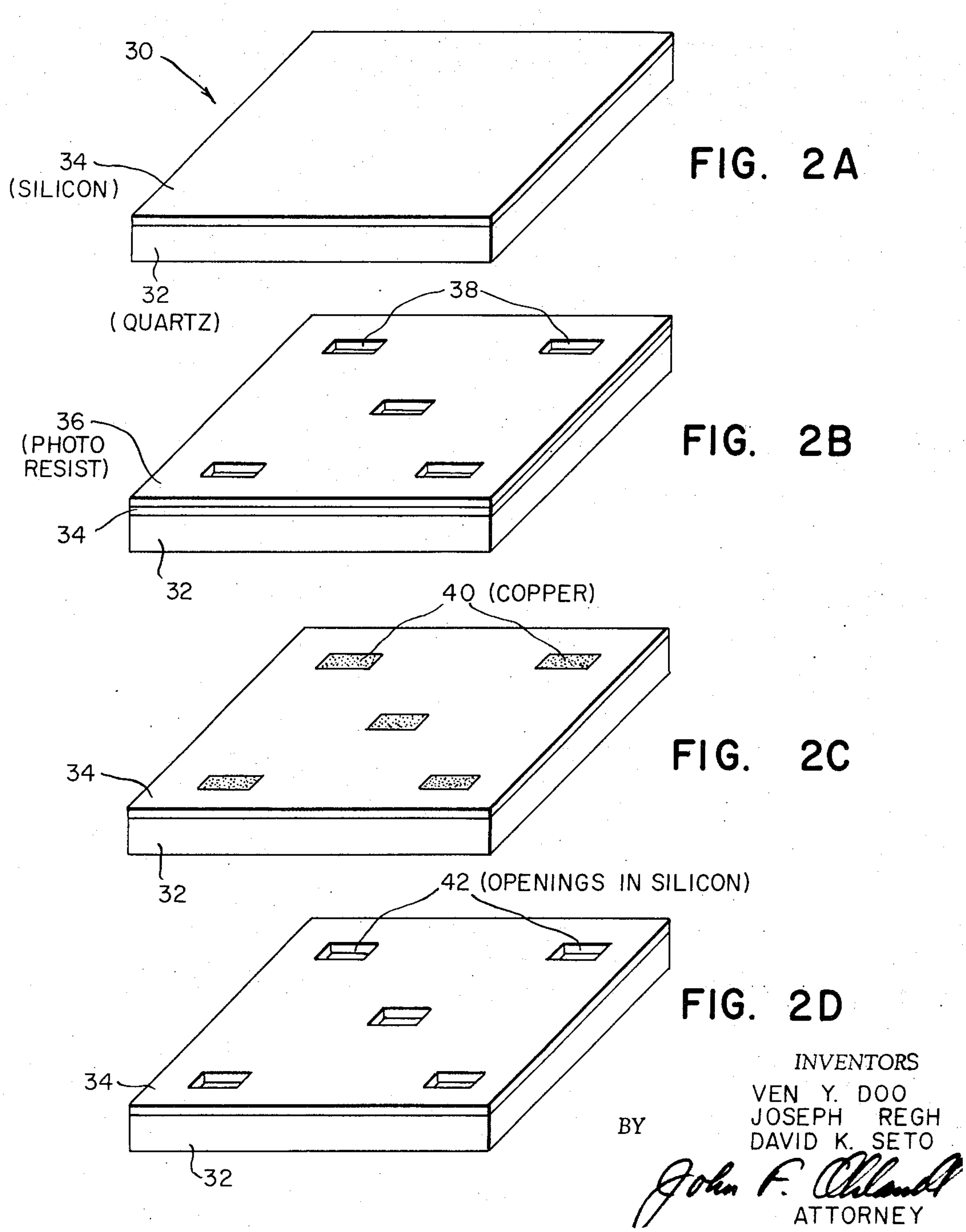
FIGS. 2A, 2B, 2C and 2D are perspective views illustrating the several steps in accordance with the technique of the present invention for producing a photolithographic mask.

Referring now to FIG. 2A, there will be seen a photolithographic mask 30, very much similar to mask 10 of FIG. 1 and to be utilized for the same basic purpose. However, in contrast to the mask 10 which includes a layer 14 of photo emulsion or the like, the photolithographic mask 30 comprises a substrate 32 of quartz or glass upon which there has been deposited a layer 34, which is either constituted of silicon or a silicon-germanium alloy.

The layer 34 can be achieved in a variety of ways such as by vapor growth onto the surface of the substrate 32. The vapor growth technique is well-known in the art, and can be appreciated by reference to U.S. Pat. 2,993,-762. Such a technique involves, for the preferred example, the pyrolysis of silane at a temperature of approximately 700° C. or below. The silicon layer 34 should have a thickness of less than 2500 A.

As illustrated in FIG. 2B, the next step in the procedure for achieving the unique photolithographic mask is to coat the already deposited silicon layer 34 with a layer 36 of photoresist material such as KTFR (material sold by Eastman-Kodak). The photoresist material is then exposed to the pattern which it is desired to create for the mask 30, and as is conventional following such exposure, the unaffected portions of the photoresist are washed away, with the result as depicted in FIG. 2B of a desired pattern of openings 38 in the photoresist.

Thereafter, the silicon which is not protected by the photoresist is etched with a copper displacement solution. For an appreciation of the details of use of such a copper displacement solution, reference may be made to U.S. Pat. 3,436,259 to Regh et al. and assigned to the assignee of the present invention. Such aqueous displacement plating solutions contain a cupric cation and fluoride anion and have a pH of less than 7. It has been found that ultrasonic agitation during this etching step enhances the etching of the silicon. The effect of the copper displacement of the silicon atoms can be seen in FIG. 2C.

Following the basic etching step described above, which is continued for about one minute, the copper is completely washed away by rinsing the wafer. However, if any residual copper remains it can be removed by a nitric acid solution. The nitric acid also acts to destroy or dissolve the remaining photoresists. The resulting structure is as illustrated in FIG. 2D in which it will be seen that the pattern of openings 42 corresponds with the selective displacement of silicon by the copper at the areas 40 which, in turn, corresponds with the selected openings 38 in the photoresists, i.e. to those areas where the photoresist was removed, thereby allowing etching of the silicon.

If necessary, a final stripping in acetone can be carried out so as to remove any residual photoresist. Subsequently, a rinse in alcohol and drying in a warm air stream can be carried out in the event the acetone is the solvent that has been used.

It will be apparent that the fundamental advantage of the copper displacement etching step resides in the fact that it does not attack the photoresist layer 36. A further advantage is that below approximately 2000 A. of silicon thickness the copper layer formed during the displacement etch appears to suppress lateral etching (undercutting) and yields a preferential etch through the film thickness. This is especially true when ultrasonic agitation enhances the removal of copper as it displaces the silcon. However, in those cases where the silicon layers were of a thickness of approximately 4000 A., undercutting was observed.

It should be particularly noted that it is advantageous to keep the masking layer quite thin. A spectrograph analysis reveals an absorption edge of 4200–5800 A. This absorption renders transmitted white light as reddish tinged. Therefore, yellow or green and longer wavelength filtered light can be utilized during superposed alignment. The adsorption edge is also convenient since most photoresists are sensitive to light of wavelength shorter than 4800 A.

In the example or embodiment already described, the substrate was indicated to be constituted of quartz, and the semiconductor material utilized therewith was silicon, and numerous experiments have been conducted utilizing these materials. However, as already noted, other semiconductor materials can serve equally as well. As another example, a silicon-germanium alloy can be employed, and, in particular, can be deposited onto glass in order to provide a suitable photolithographic mask by a reaction such as simple pyrolysis or by other low temperature vapor growth reactions.

In the event that it is desired to use soft glass rather than quartz as the substrate, it is desirable, in order to accommodate the low temperature softening characteristic of such glass, that silicon be deposited by radio-frequency sputtering. In an experiment that was conducted, silicon was sputtered onto 2½" x 2½" glass plates to a thickness of approximately 1200 A., where the substrate was heated to 300° C. for adhesion enhancement.

What has been disclosed is an improvement in photolithographic masks and in the technique of producing such masks. In accordance with the invention as described, a photolithographic mask is realized comprising a substrate of quartz of glass and a thin, pattern-defining layer of semiconductor material formed on the substrate, the pattern being defined in the semiconductor material by displacement etching of the semiconductor layer. By such technique a high resolution mask is obtained and the principal advantages reside in the relative transparency of the semiconductor material which makes it possible to view the the previous patterns that have been developed on the wafer through said mask. An additional advantage is that oxidation techniques can be utilized to enhance mask durability and promote anti-reflection properties.

While there have been shown and described and pointed out the fundamental novel features of the invention as applied to the preferred embodiments, it will be understood that various omissions and substitutions and changes in the form and details of the device illustrated and in its operation may be made by those skilled in the art without departing from the spirit of the invention. It is the intention, therefore, to be limited only as indicated by the scope of the following claims.

What is claimed is:

1. A process of fabricating a photolithographic mask comprising:

providing a substrate of glass or quartz, forming on a major surface of said substrate a thin layer of an inorganic semiconductor material having a thickness of form approximately 1200 angstroms to less than about 2500 angstroms, forming a patterned resist mask on the surface of said thin layer by coating said thin layer with a layer of photoresist, and then exposing and developing the photoresist layer, contacting the portions of said thin layer, which are unprotected by said resist mask, with a displacement plating solution containing a cupric cation and a fluoride anion, said plating solution chemically reacting with the unprotected portions of said thin layer such that the semiconductor material is removed from the unprotected areas and copper is deposited in place of the semiconductor material, and rinsing with a nitric acid solution to remove said copper deposit and said resist mask from said substrate and remaining thin layer so as to leave a patterned thin layer of semiconductor material having straight sided openings.

2. A process as defined in claim 1, in which the semiconductor material is silicon or silicon-germanium alloy.

3. A process in accordance with claim 1 wherein the displacement etch step is accompanied by ultrasonic agitation.

References Cited

UNITED STATES PATENTS

| | | | |
|---|---|---|---|
| 3,482,977 | 12/1969 | Baker | 96—36 |
| 3,415,648 | 12/1968 | Certa | 96—36 |
| 3,436,259 | 4/1969 | Regh et al. | 117—227 |
| 3,224,904 | 12/1965 | Klein | 156—17 |
| 3,342,657 | 9/1967 | Reisman et al. | 156—17 |
| 2,447,836 | 8/1948 | Beeber et al. | 96—38.6 |

J. TRAVIS BROWN, Primary Examiner

E. C. KIMLIN, Assistant Examiner

U.S. Cl. X.R.

96—36.1, 36.2; 156—17